(12) United States Patent
Fukushi

(10) Patent No.: US 11,945,074 B2
(45) Date of Patent: Apr. 2, 2024

(54) PROCESSING APPARATUS

(71) Applicant: DISCO CORPORATION, Tokyo (JP)

(72) Inventor: Nobuyuki Fukushi, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 488 days.

(21) Appl. No.: 17/166,240

(22) Filed: Feb. 3, 2021

(65) Prior Publication Data

US 2021/0252661 A1 Aug. 19, 2021

(30) Foreign Application Priority Data

Feb. 17, 2020 (JP) .................. 2020-024140

(51) Int. Cl.
| | |
|---|---|
| *B24B 49/04* | (2006.01) |
| *B24B 5/02* | (2006.01) |
| *B24B 5/313* | (2006.01) |
| *B24B 7/22* | (2006.01) |
| *B24B 51/00* | (2006.01) |
| *H01L 21/304* | (2006.01) |
| *H01L 21/687* | (2006.01) |

(52) U.S. Cl.
CPC ............... *B24B 49/04* (2013.01); *B24B 5/02* (2013.01); *B24B 5/313* (2013.01); *B24B 7/22* (2013.01); *B24B 51/00* (2013.01); *H01L 21/304* (2013.01); *H01L 21/68707* (2013.01); *H01L 21/68714* (2013.01)

(58) Field of Classification Search
CPC . B24B 27/0069; B24B 41/005; B24B 37/005; B24B 37/042; B24B 37/0053; B24B 49/02; B24B 49/04; B24B 7/04; B24B 7/228; B24B 37/345; B24B 51/00

USPC .................. 451/339, 403, 5, 9, 41, 283, 285
See application file for complete search history.

(56) References Cited

U.S. PATENT DOCUMENTS

2018/0102268 A1* 4/2018 Sekiya ............. H01L 21/67288

FOREIGN PATENT DOCUMENTS

JP 2015213995 A 12/2015

* cited by examiner

*Primary Examiner* — Eric J Rosen
*Assistant Examiner* — Sharonda T Felton
(74) *Attorney, Agent, or Firm* — Greer Burns & Crain Ltd.

(57) ABSTRACT

A processing apparatus includes a chuck table for holding a workpiece that has a mark representing a crystal orientation, a processing unit, a cassette stage for placing thereon a cassette for storing a plurality of workpieces therein, a temporary rest table, a spinner table, a robot for delivering a workpiece, a determining section for determining whether a workpiece has been properly processed or has not been properly processed, and a control unit for performing a control process for orienting the mark of the workpiece in a predetermined direction if the determining section determines that the workpiece has been properly processed and storing the workpiece in the cassette, and performing a control process for orienting the mark of the workpiece in a direction different from the predetermined direction if the determining section determines that the workpiece has not been properly processed and storing the workpiece in the cassette.

6 Claims, 4 Drawing Sheets

PROCESSING APPARATUS

BACKGROUND OF THE INVENTION

Field of the Invention

The present invention relates to an apparatus for processing a workpiece such as a semiconductor wafer, and more particularly to a processing apparatus that is capable of ascertaining whether or not a workpiece processed thereby has been properly processed.

Description of the Related Art

For example, a fully automatic grinding apparatus for grinding a workpiece with grindstones to thin the workpiece (see, for example, Japanese Patent Laid-Open No. 2015-213995) includes a cassette stage for placing thereon a cassette that houses a plurality of workpieces on respective shelves therein, a temporary rest table for temporarily placing a workpiece thereon, a chuck table having a holding surface for holding a workpiece thereon, a grinding unit for grinding a workpiece held on the chuck table with grindstones, a spinner table for holding a workpiece that has been ground while it is being cleaned, a robot for delivering a workpiece from the cassette to the temporary rest table or delivering a workpiece from the spinner table to the cassette, a first delivery mechanism for delivering a workpiece from the temporary rest table to the chuck table, and a second delivery mechanism for delivering a workpiece from the chuck table to the spinner table.

SUMMARY OF THE INVENTION

Workpieces have an orientation flat or notch that is indicative of their crystal orientation. Workpieces that have been ground are stored back in the cassette with their orientation flats aligned with each other regardless of whether or not they have been properly ground. Consequently, the worker who deals with the grinding apparatus is unable to visually check if a workpiece stored back in the cassette has been properly processed or not. One solution has been to display workpiece data about each of the workpieces placed on respective shelves in the cassette as recognized by the grinding apparatus on a display screen thereof such as a touch panel, so that the worker can perform a workpiece removing process to remove an improperly processed workpiece from the workpieces stored in the cassette while referring to the workpiece data displayed on the display screen and visually comparing the actual shelves in the cassette and the displayed workpiece data. However, such a workpiece removing process has been tedious and time-consuming.

It is therefore an object of the present invention to provide a processing apparatus that enables the worker to quickly and easily recognize whether processed workpieces placed on respective shelves in a cassette have been properly processed or not by looking at the inside of the cassette.

In accordance with an aspect of the present invention, there is provided a processing apparatus. The processing apparatus includes a chuck table for holding a workpiece that has a mark representing a crystal orientation on a holding surface thereof, a processing unit for grinding the workpiece held on the chuck table with grindstones or polishing the workpiece held on the chuck table with a polishing pad, a cassette stage for placing thereon a cassette for storing a plurality of workpieces on respective shelves therein, a temporary rest table for temporarily placing a workpiece thereon, a spinner table for holding a workpiece to be cleaned thereon, a robot for delivering a workpiece from the cassette placed on the cassette stage to the temporary rest table or delivering a workpiece held on the spinner table into the cassette placed on the cassette stage, a determining section for determining whether a workpiece has been properly processed or has not been properly processed, and a control unit for performing a control process for orienting the mark of the workpiece in a predetermined direction if the determining section determines that the workpiece has been properly processed, and storing the workpiece in the cassette, and performing a control process for orienting the mark of the workpiece in a direction different from the predetermined direction if the determining section determines that the workpiece has not been properly processed, and storing the workpiece in the cassette.

Preferably, the processing apparatus further includes a thickness measuring unit for measuring the thickness of the workpiece, in which the determining section determines whether the workpiece has been properly processed or has not been properly processed on the basis of the thickness of the workpiece measured by the thickness measuring unit.

Preferably, the determining section includes a plurality of determining sections, the direction different from the predetermined direction includes different directions that are preset as disagreeing with each other in association with the respective determining sections, the determining sections determine whether the workpiece has been properly processed or has not been properly processed according to respective different determining criteria, and if at least one of the determining sections determines that the workpiece has not been properly processed, the control unit performs a control process for orienting the mark of the workpiece in the direction preset in association with the determining section that determines that the workpiece has not been properly processed and stores the workpiece in the cassette.

The processing apparatus according to the aspect of the present invention includes the determining section for determining whether a workpiece has been properly processed or has not been properly processed, and the control unit for performing the control process for orienting the mark of the workpiece in the predetermined direction if the determining section determines that the workpiece has been properly processed, and storing the workpiece in the cassette, and performing the control process for orienting the mark of the workpiece in the direction different from the predetermined direction if the determining section determines that the workpiece has not been properly processed, and storing the workpiece in the cassette. Therefore, the worker can easily know whether the workpiece has been properly processed or has not been properly processed by looking at the orientation of the mark of the workpiece stored in the cassette. The worker can then easily remove only the workpiece that has not been properly processed without taking the trouble to compare workpiece data on a display screen of the apparatus. Consequently, it is possible for the worker to easily deliver the cassette from which workpieces that have not been properly processed have been removed to an apparatus in a next processing step.

In a case where the processing apparatus further includes the thickness measuring unit for measuring the thickness of a workpiece, and the determining section determines whether the workpiece has been properly processed or has not been properly processed on the basis of the thickness of the workpiece measured by the thickness measuring unit, the control unit can easily perform the control process for orienting the mark of the workpiece in the predetermined direction or the control process for orienting the mark of the workpiece in the direction different from the predetermined direction.

The determining section may include the plurality of determining sections, the direction different from the predetermined direction may include different directions that are preset as disagreeing with each other in association with the respective determining sections, and the determining sections may determine whether the workpiece has been properly processed or has not been properly processed according to respective different determining criteria. In this case, if at least one of the determining sections determines that the workpiece has not been properly processed, the control unit performs the control process for orienting the mark of the workpiece in the direction preset in association with the determining section that determines that the workpiece has not been properly processed and stores the workpiece in the cassette. Therefore, the worker can easily know whether the workpiece has been properly processed or has not been properly processed by looking at the orientation of the mark of the workpiece stored in the cassette and can recognize the kind of an abnormality of the workpiece that has not been properly processed.

The above and other objects, features and advantages of the present invention and the manner of realizing them will become more apparent, and the invention itself will best be understood from a study of the following description and appended claims with reference to the attached drawings showing a preferred embodiment of the present invention.

DETAILED DESCRIPTION OF THE PREFERRED EMBODIMENT

A preferred embodiment of the present invention will be described below with reference to the accompanying drawings.

Figure 1:
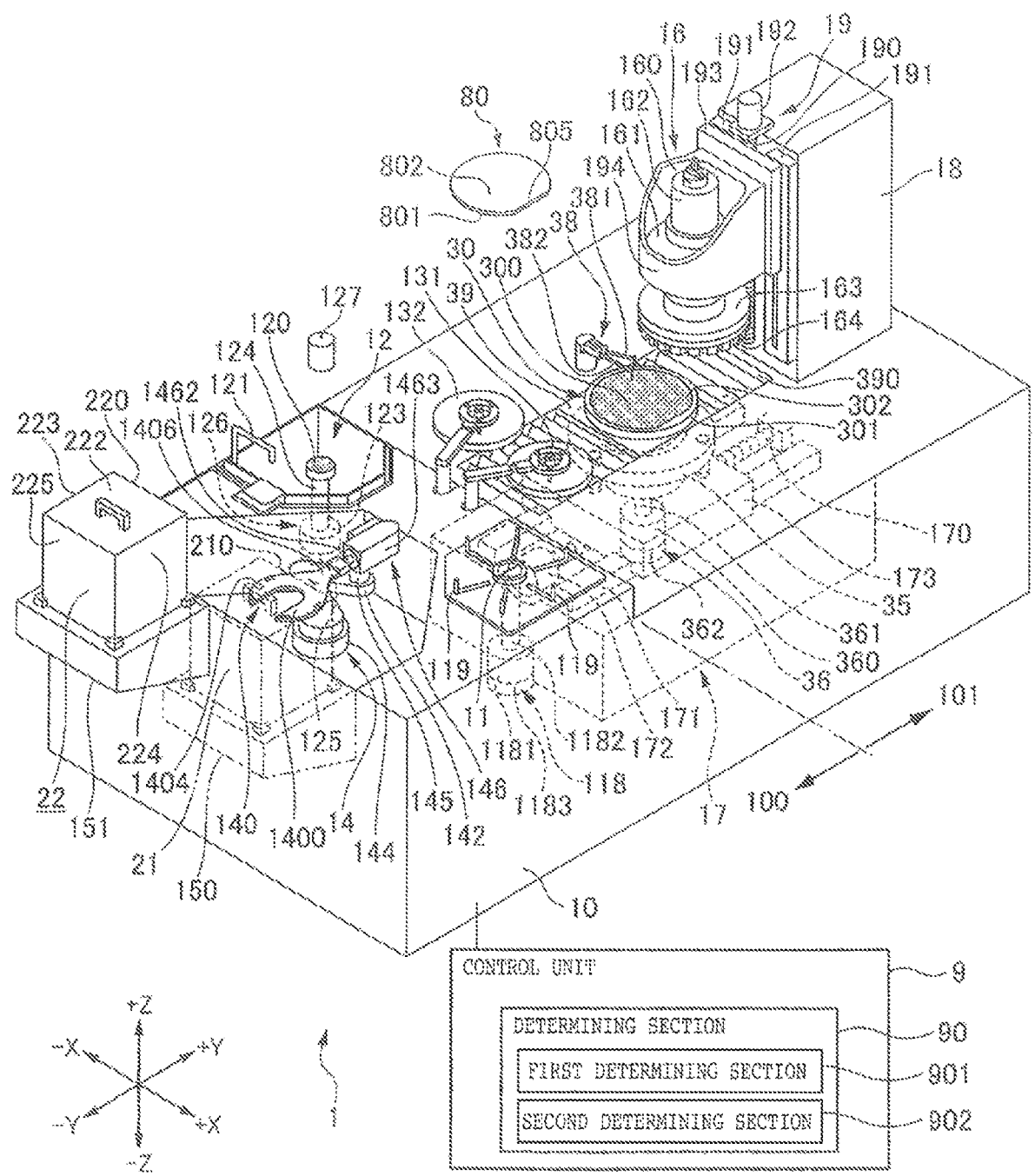
FIG. 1 is a perspective view illustrating by way of example a processing apparatus according to an embodiment of the present invention.

A processing apparatus 1 illustrated in FIG. 1 according to the preferred embodiment of the present invention is a grinding apparatus for grinding a workpiece 80 held on a chuck table 30 with a processing unit 16. For the purpose of giving an orientational frame of reference to the processing apparatus 1, there are established mutually perpendicular X-axis, Y-axis, and Z-axis directions described and illustrated with respect to various components of the processing apparatus 1. The X-axis directions include a +X direction and a −X direction as opposite directions, the Y-axis directions include a +Y direction and a −Y direction as opposite directions, and the Z-axis directions include a +Z direction and a −Z direction as opposite directions.

Note that the processing apparatus 1 includes a base 10 over which a front area extends in the −Y direction as a loading/unloading area 100 for loading a workpiece 80 onto the chuck table 30 and unloading a workpiece 80 from the chuck table 30 and a rear area extends in the +Y direction as a processing area 101 for performing a grinding process on a workpiece 80 held on the chuck table 30 with the processing unit 16.

The processing apparatus 1 according to the present invention may be arranged such that it has, as the processing unit, two grinding units including a rough grinding unit and a finishing grinding unit, and a turntable for positioning the chuck table 30 with the workpiece 80 held thereon below one of the grinding units at a time. Alternatively, the processing apparatus according to the present invention may be arranged such that it has, as the processing unit, a polishing unit for polishing a workpiece with a polishing pad to process a target surface of the workpiece 80 to a mirror finish or to increase the flexural strength of the workpiece 80.

The processing apparatus 1 includes a control unit 9 for controlling components thereof. The control unit 9 includes a central processing unit (CPU) for performing arithmetic processing operations according to control programs and a storage device such as a memory. The control unit 9 is electrically connected to the components of the processing unit 16 to control the components.

According to the present embodiment, the workpiece 80 illustrated in FIG. 1 includes a circular semiconductor wafer made of a base material of silicon or the like. The workpiece 80 has a face side 801 facing downwardly in FIG. 1 with a plurality of devices formed thereon. The face side 801 is protected by a protective tape, not illustrated, affixed thereto. The workpiece 80 has a reverse side 802 facing upwardly in FIG. 1 that is a target surface to be ground. Note that the workpiece 80 may be made of, instead of silicon, gallium arsenide, sapphire, gallium nitride, resin, ceramic, silicon carbide, or the like.

The workpiece 80 has an orientation flat as a mark 805 indicative of its crystal orientation, formed in an outer circumferential portion thereof by removing part of the outer circumferential portion, leaving an arcuate recess with a flat edge. The mark 805 may be in the form of a notch indicative of the crystal orientation. The notch may be a recess formed in an outer circumferential edge of the workpiece 80 as being recess radially inwardly toward the center of the workpiece 80.

A first cassette stage 150 and a second cassette stage 151 for placing thereon respective cassettes each for storing a plurality of workpieces 80 on respective shelves therein are disposed on a front wall of the base 10 that faces in the −Y direction. A first cassette 21 in which a plurality of workpieces 80 to be processed are stored on respective shelves therein is placed on the first cassette stage 150. A second cassette 22 in which a plurality of workpieces 80 that have been processed are stored on respective shelves therein is placed on the second cassette stage 151.

Since the second cassette 22 and the first cassette 21 are substantially identical in structure to each other, the structure of the second cassette 22 will hereinafter be described below whereas the structure of the first cassette 21 will not be described below.

For example, the second cassette 22 having the shelves for storing a plurality of workpieces 80 that have been processed, i.e., ground, thereon is also known as a closed front opening unified pod (FOUP). The second cassette 22 includes at least a top plate 222 supporting on its upper surface a handle 228 that can be gripped by the worker, two side plates 223 and 224 extending downwardly in the −Z direction from opposite side edges of the top plate 222 and horizontally facing each other, a rear plate 225 joined to respective rear edges of the side plates 223 and 224, a plurality of shelves 226 formed on inner side surfaces of the side plates 223 and 224 that face each other in the X-axis directions, for storing a plurality of workpieces 80, and a bottom plate 227 joining respective lower ends of the side plates 223 and 224, and the rear plate 225.

The shelves 226 for storing the workpieces 80 respectively are vertically spaced at predetermined intervals in the Z-axis directions and have central access ports for a robot 14 illustrated in FIG. 1 to enter the shelves 226 therethrough. The shelves 226 support outer circumferential portions of the workpieces 80. The robot 14 can move from the access ports to positions directly below the workpieces 80 stored in the shelves 226. Note that, according to the present embodiment, the second cassette 22 is of the closed type for protection against entry of dirt and dust. However, the second cassette 22 may be an open cassette.

Figure 2:
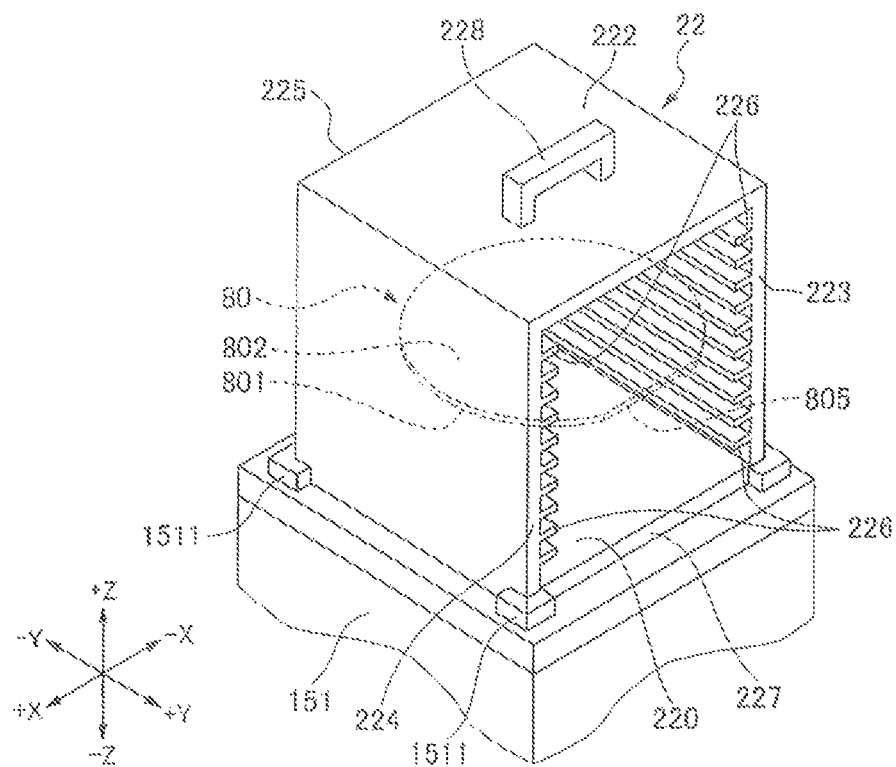
FIG. 2 is a perspective view illustrating by way of example a second cassette and a second cassette stage of the processing apparatus.

As illustrated in FIG. 2, the second cassette 22 has a front opening 220 that is open in the +Y direction. The front opening 220 is defined by respective front edges of the top plate 222, the side plates 223 and 224, and the bottom plate 227. Workpieces 80 can be loaded into and unloaded from the second cassette 22 through the front opening 220 by the robot 14 as it enter the access ports of the shelves 226. When the second cassette 22 itself is to be sent from the processing apparatus 1 to another apparatus in a next processing step, the front opening 220 is closed by a cassette lid, not illustrated, for example. When workpieces 80 are to be removed from the second cassette 22, an opening/closing handle on the cassette lid is turned by an opening/closing mechanism, not illustrated, or the like of the processing apparatus 1, opening the cassette lid.

Four cassette retainers 1511 for preventing the second cassette 22 placed on an upper surface of the second cassette stage 151 from being shifted horizontally parallel to a plane defined by the X-axis and Y-axis directions are disposed on the upper surface of the second cassette stage 151 in alignment with respective four corners of the bottom plate 227 of the second cassette 22.

As illustrated in FIG. 1, the processing apparatus 1 includes a temporary rest table 11 for temporarily placing a workpiece 80 thereon, a spinner table 120 for holding and rotating a workpiece 80 while it is being cleaned, and the robot 14 for delivering a workpiece 80 from the first cassette 21 placed on the first cassette stage 150 onto the temporary rest table 11 or delivering a workpiece 80 from the spinner table 120 into the second cassette 22 placed on the second cassette stage 151.

As illustrated in FIG. 1, the robot 14 is disposed behind the opening 210 of the first cassette 21 that is open in the +Y direction. The robot 14 is a multi-joint robot and includes a robot hand 140 having a suction surface 1404 for holding a workpiece 80 under suction thereon, a horizontal hand moving mechanism 142 for horizontally moving the robot hand 140, a vertical hand moving mechanism 144 such as an electric actuator for vertically moving the robot hand 140, and a hand inverting mechanism 146 for vertically inverting the suction surface 1404 of the robot hand 140, for example.

The horizontal hand moving mechanism 142 is of a structure for turning, with a swivel motor, a swivel arm made up of a plurality of plate-shaped arm members or the like and housing a pulley mechanism therein, for example. Specifically, the horizontal hand moving mechanism 142 can turn the robot hand 140 in a horizontal plane defined by the X-axis and Y-axis directions by turning the plate-shaped arm members with respect to each other about rotational shafts whose axes extend in the Z-axis directions, i.e., vertical directions. Furthermore, the horizontal hand moving mechanism 142 can change its shape from a state in which the plate-shaped arm members cross each other to a state in which the plate-shaped arm members are aligned straight with each other, etc., for thereby causing the robot hand 140 to make linear motion in the horizontal plane.

The vertical hand moving mechanism 144 is connected to a lower portion of the horizontal hand moving mechanism 142. The vertical hand moving mechanism 144 can cooperate with the horizontal hand moving mechanism 142 in vertically moving the robot hand 140 in the Z-axis directions to position the robot hand 140 at a given height.

A housing 1463 is fixedly mounted on one of the plate-shaped arm members of the horizontal hand moving mechanism 142 by a columnar arm joint 145. The hand inverting mechanism 146 includes a spindle 1462 having a central axis extending in the Y-axis directions that are perpendicular to the Z-axis directions in FIG. 1. The spindle 1462 is rotatably supported in the housing 1463. For example, the housing 1463 houses therein an inverting motor, not illustrated, for rotating the spindle 1462 about its central axis.

The spindle 1462 has a distal end portion protruding from the housing 1463, and the robot hand 140 has a proximal end mounted on a holder disposed on the protruding distal end portion of the spindle 1462. When the inverting motor, not illustrated, is energized, the spindle 1462 is turned about its central axis through a predetermined angle, rotating the robot hand 140 connected to the spindle 1462 by the holder to invert the suction surface 1404 of the robot hand 140, i.e., to turn the suction surface 1404 of the robot hand 140 upside down.

For example, the robot hand 140 is of a plate shape for holding a workpiece 80 under suction and has a substantially U-shaped profile as a whole as viewed in plan. The robot hand 140 includes a base 1406 shaped as a flat rectangular plate mounted on the holder and a suction member 1400 integrally formed with the base 1406. The suction member 1400 has a U-shaped opening defined therein. Note that the robot hand 140 is not limited to the illustrated shape according to the present embodiment but may be of a substantially rice-scoop shape as a whole as viewed in plan.

For example, the robot hand 140 has an upper surface illustrated in FIG. 1 as the suction surface 1404 for holding a workpiece 80 under suction thereon. Note that the robot hand 140 has a lower surface opposite the suction surface 1404, which may also be a suction surface. The suction surface 1404 has been processed to a smooth finish and may have edges beveled to safeguard against damage that may be caused to a workpiece 80 upon contact with the workpiece 80.

A plurality of suction ports are open in the suction surface 1404. The suction ports include three or four suction ports that are open in each of five areas located at substantially equal spaced intervals along an outer circumferential portion of the suction surface 1404, for example. However, the suction ports are not limited to the number and locations according to the present embodiment. The suction ports may include respective elastically deformable rubber suction cups or the like disposed therein.

Resin tubes are held in fluid communication with the respective suction ports through couplings or the like. The resin tubes are flexible enough to allow the robot hand 140 to turn and move as desired. The resin tubes are connected to a suction source such as a vacuum generator or an ejector mechanism.

The temporary rest table 11 is disposed within the movable range of the robot 14. The temporary rest table 11 is combined with a positioning unit 119.

The temporary rest table 11 is of a circular shape smaller in diameter than workpieces 80, for example, and has a flat upper surface acting as a temporary rest surface for temporarily placing a workpiece 80 thereon. The positioning unit 119 includes a plurality of, e.g., six, positioning pins disposed in an annular pattern at equally spaced intervals around the temporary rest table 11. The positioning pins are movable radially inwardly toward and outwardly away from the temporary rest table 11. A workpiece 80 that is temporarily placed on the temporary rest table 11 is positioned or centered at a predetermined position on the temporary rest table 11 when the positioning pins of the positioning unit 119 are radially moved into contact with the outer circumferential edge of the workpiece 80.

A temporary rest table rotating mechanism 118 including an electric motor 1181, a spindle 1182, etc. is connected to a lower surface of the temporary rest table 11. When the electric motor 1181 is energized, the temporary rest table 11 is rotated by the spindle 1182 that has its central axis extending in the Z-axis directions. The electric motor 1181 is a servomotor, for example, associated with an encoder 1183 electrically connected to the control unit 9 that also has a function as a servo amplifier. When the control unit 9 supplies an operation signal from an output interface thereof to the electric motor 1181, the electric motor 1181 is energized, rotating the spindle 1182 about its central axis. The encoder 1883 detects a rotational speed of the electric motor 1181 and hence the spindle 1182 and outputs the detected rotational speed as an encoder signal to an input interface of the control unit 9. When the control unit 9 receives the encoder signal representing the rotational speed detected by the encoder 1183, the control unit 9 recognizes a succession of rotational angles of the temporary rest table 11.

A loading arm 131 including a suction pad or the like for holding a workpiece 80 is angularly movably disposed in a position adjacent to the temporary rest table 11. The loading arm 131 holds a workpiece 80 that has been centered on the temporary rest table 11 and delivers the workpiece 80 to the chuck table 30 that is placed in a loading position in the processing area 101. An unloading arm 132 including a suction pad or the like for holding a processed workpiece 80 is angularly movably disposed next to the loading arm 131.

A workpiece-by-workpiece-type cleaning unit 12 for cleaning a processed workpiece 80 delivered by the unloading arm 132 is disposed within the movable range of the unloading arm 132. The cleaning unit 12 includes the spinner table 120 that is smaller in diameter than workpieces 80 and a cleaning nozzle 121 angularly movable over a workpiece 80 held on the spinner table 120. While the workpiece 80 is being held on the spinner table 120 and rotated thereby, the cleaning nozzle 121 ejects a cleaning fluid to the reverse side 802 of the workpiece 80 to clean the reverse side 802.

A spinner table rotating mechanism 126 including an electric motor 123, a spindle 124, etc. is connected to a lower surface of the spinner table 120 for rotating the spinner table 120 about its central axis extending in the Z-axis directions. The electric motor 123 is a servomotor, for example, associated with an encoder 125 electrically connected to the control unit 9 that also has a function as a servo amplifier. When the control unit 9 supplies an operation signal from the output interface to the electric motor 123, the electric motor 123 is energized, rotating the spindle 124 about its central axis. The encoder 125 detects a rotational speed of the electric motor 123 and hence the spindle 124 and outputs the detected rotational speed as an encoder signal to the input interface of the control unit 9. When the control unit 9 receives the encoder signal representing the rotational speed detected by the encoder 125, the control unit 9 recognizes a succession of rotational angles of the spinner table 120.

An image capturing unit 127 is disposed above the spinner table 120. The image capturing unit 127 includes a light applying unit, not illustrated, for applying light to the reverse side 802, i.e., the target surface to be ground, of a workpiece 80 held on the spinner table 120, an optical system such as lenses for capturing reflected light from the workpiece 80, and a camera, not illustrated, such as an image capturing device for outputting a subject image focused by the optical system.

According to the present embodiment, the chuck table 30 illustrated in FIG. 1 includes a circular suction member 300 made of a porous material or the like for attracting a workpiece 80 under suction thereon and a frame 301 that supports the suction member 300. The suction member 300 is held in fluid communication with a suction source, not illustrated, such as a vacuum generator. When the suction source is actuated, it produces a negative pressure, transmitting a suction force to a holding surface 302 provided by an exposed upper surface of the suction member 300 to enable the chuck table 30 to hold the workpiece 80 under suction on the holding surface 302. For example, the holding surface 302 is of a shape identical to the workpiece 80 that has the mark 805 as the orientation flat representative of the crystal orientation of the workpiece 80. In other words, the circular suction member 300 has an outer circumferential portion partly removed in tangential directions, leaving an arcuate recess with a flat edge. The arcuate recess with the flat edge in the suction member 300 will also be referred to as "orientation flat alignment part." The orientation flat alignment part will be used to align itself with the mark 805 of a workpiece 80 when the workpiece 80 is placed on the chuck table 30.

The chuck table 30 is peripherally surrounded by a cover 39. The chuck table 30 is reciprocably movable on the base 10 in the Y-axis directions by a table moving mechanism 17 disposed in the base 10 below the cover 39 and a bellows cover 390 coupled to the cover 39. The chuck table 30 is also rotatable about a rotational axis extending in the Z-axis directions by a chuck table rotating mechanism 36.

The table moving mechanism 17 includes a ball screw 170 having a central axis extending in the Y-axis directions, a pair of guide rails 171 extending parallel to the ball screw 170 and disposed one on each side of the ball screw 170, an electric motor 172 coupled to an end of the ball screw 170 for rotating the ball screw 170 about its central axis, and a movable plate 173 having an internal nut, not illustrated, threaded over the ball screw 170 and a pair of side portions held in slidable contact with the guide rails 171. The chuck table 30 is mounted on the movable plate 173 with a table base 35 interposed therebetween. When the electric motor 172 is energized, it rotates the ball screw 170 about its central axis, causing the nut to move the movable plate 173 linearly in one of the Y-axis directions while being guided along the guide rails 171, moving the chuck table 30 mounted on the movable plate 173 in the same Y-axis direction through the table base 35.

The chuck table 30 is detachably secured to the table base 35. The chuck table rotating mechanism 36 includes an electric motor 360, a spindle 361, etc. and is connected to a lower surface of the table base 35. The electric motor 360 is a servomotor, for example, associated with an encoder 362 electrically connected to the control unit 9 that also has a function as a servo amplifier. When the control unit 9 supplies an operation signal from the output interface to the electric motor 360, the electric motor 360 is energized, rotating the spindle 361 about its central axis. The encoder 362 detects a rotational speed of the electric motor 360 and hence the spindle 361 and outputs the detected rotational speed as an encoder signal to the input interface of the control unit 9. When the control unit 9 receives the encoder signal representing the rotational speed detected by the encoder 362, the control unit 9 recognizes a succession of rotational angles of the temporary rest table 11 and the orientation or position of the arcuate recess with the flat edge in the suction member 300, which corresponds to the mark 805 of the workpiece 80 on the holding surface 302 of the chuck table 30.

A column 18 is erected on the base 10 in a rear portion of the processing area 101 in the +Y direction. The column 18 supports a grinding feed mechanism 19 on a front surface that faces in the −Y direction. The grinding feed mechanism 19 moves, i.e., grinding-feeds, the processing unit 16 and the chuck table 30 relatively to each other in the Z-axis directions perpendicular to the holding surface 302. The grinding feed mechanism 19 includes a ball screw 190 having a central axis extending in the Z-axis directions, a pair of guide rails 191 extending parallel to the ball screw 190 and disposed one on each side of the ball screw 190, an electric motor 192 coupled to an upper end of the ball screw 190 for rotating the ball screw 190 about its central axis, a vertically movable plate 193 having an internal nut, not illustrated, threaded over the ball screw 190 and a pair of side portions held in slidable contact with the guide rails 191, and a holder 194 coupled to the vertically movable plate 193 and holding the processing unit 16. When the electric motor 192 is energized, it rotates the ball screw 190 about its central axis, causing the internal nut to move the vertically movable plate 193 in one of the Z-axis directions while being guided along the guide rails 191, moving, i.e., processing-feeding, the processing unit 16 held by the holder 194 in the same Z-axis direction.

The processing unit 16 that grinds a workpiece 80 held on the chuck table 30 includes a rotational shaft 160 having a central axis extending in the Z-axis direction, a housing 161 in which the rotational shaft 160 is rotatably supported, an electric motor 162 for rotating the rotational shaft 160 about its central axis, an annular mount 163 connected to a lower end of the rotational shaft 160, and a grinding wheel 164 detachably mounted on a lower surface of the annular mount 163.

The grinding wheel 164 includes a wheel base and a plurality of grindstones, each shaped as a substantially rectangular parallelepiped, mounted in an annular array on a lower surface of the wheel base. The grindstones are made of abrasive grains held firmly together by a binder or the like, for example.

The rotational shaft 160 has a fluid channel, not illustrated, defined axially therethrough in the Z-axis directions as a passage for a grinding fluid. The fluid channel also extends through the annular mount 163 and is open at the lower surface of the wheel base for ejecting the grinding fluid from a grinding fluid source, not illustrated, toward the grindstones.

A contact-type thickness measuring unit 38 for measuring the thickness of a workpiece 80 that is being ground while in contact therewith is disposed in a position near the grinding wheel 164 that has been lowered to a height or vertical position at which the grinding wheel 164 grinds the workpiece 80. The thickness measuring unit 38 includes, for example, a pair of thickness measuring devices or height gages, i.e., a first thickness measuring device, i.e., a first height gage, 381 for measuring the vertical position of the holding surface 302 of the chuck table 30, and a second thickness measuring device, i.e., a second height gage, 382 for measuring the vertical position of the reverse side 802 of the workpiece 80 held on the chuck table 30.

Each of the first thickness measuring device 381 and the second thickness measuring device 382 has a contact portion vertically movable into contact with a surface to be measured. Specifically, the first thickness measuring device 381 and the second thickness measuring device 382 are vertically movably supported and can be held against the respective surfaces to be measured under an appropriate force. The first thickness measuring device 381 measures or detects the vertical position of the holding surface 302 that acts as a reference surface, whereas the second thickness measuring device 382 measures or detects the vertical position of the reverse side 802, which faces upwardly, of the workpiece 80 to be ground. The thickness measuring unit 38 calculates the difference between the detected vertical positions, thereby sequentially measuring the thickness of the workpiece 80 while the workpiece 80 is being ground.

Note that the thickness measuring unit 38 may be a non-contact thickness measuring unit.

The processing apparatus 1 according to the present invention includes a determining section 90 for determining whether a workpiece 80 that has been ground is a workpiece that has been properly processed or a workpiece that has not been properly processed. According to the present embodiment, the determining section 90 is included in the control unit 9.

The determining section 90 includes a plurality of, e.g., two, determining sections that are able to determine whether a workpiece 80 that has been ground is a workpiece that has been properly processed or a workpiece that has not been properly processed according to respective different determining criteria. According to the present embodiment, specifically, the determining section 90 includes a first determining section 901 for determining whether a workpiece 80 is a workpiece that has been properly processed or a workpiece that has not been properly processed or a workpiece whose thickness prior to being ground, i.e., charged thickness, is abnormal and which is not to be ground, on the basis of the thickness of the workpiece 80 measured by the thickness measuring unit 38, and a second determining section 902 for determining whether a workpiece 80 is cracked, chipped on its outer circumference, or burned on its surface or not from an image captured by the image capturing unit 127 of the reverse side 802 of the workpiece 80 that has been cleaned on the spinner table 120, and determining that the workpiece 80 is a workpiece that has been properly processed if the workpiece 80 is not cracked, chipped, or burned and that the workpiece 80 is a workpiece that has not been properly processed if the workpiece 80 is cracked, chipped, or burned.

According to the present embodiment, if the determining section 90 has determined that the workpiece 80 has been properly processed, the control unit 9 performs a control process for orienting the mark 805 in a predetermined direction 99, hereinafter referred to as "properly processed direction 99" illustrated in FIG. 4, and stores the workpiece 80 that has been processed into the second cassette 22, and if the determining section 90 has determined that the workpiece 80 has not been properly processed, the control unit 9 performs a control process for orienting the mark 805 in a direction different from the properly processed direction 99, and stores the workpiece 80 that has been processed or that has not yet been processed into the second cassette 22.

According to the present embodiment, the determining section 90 includes the first determining section 901 and the second determining section 902, and in a case where at least one of the first determining section 901 and the second determining section 902, i.e., one or more of the plurality of determining sections, determines that the workpiece 80 has not been properly processed, the control unit 9 performs the control process for orienting the mark 805 in the direction set in the determining section that has determined that the workpiece 80 has not been properly processed and different from the properly processed direction 99, and stores the workpiece 80 into the second cassette 22. For example, the different direction preset in the first determining section 901 and applied in a case where the workpiece 80 has not been properly processed will hereinafter be referred to as "processed thickness abnormality direction 98" (see FIG. 5). The different direction preset in the second determining section 902 and applied in a case where the workpiece 80 has not been properly processed will hereinafter be referred to as "processed crack, etc. abnormality direction 97" (see FIG. 6). The processed thickness abnormality direction 98 and the processed crack, etc. abnormality direction 97 have been preset as disagreeing with each other.

Operation of the processing apparatus 1 illustrated in FIG. 1 for grinding a workpiece 80 held on the chuck table 30 will hereinafter be described in detail below.

(Grinding of First Workpiece 80)

Under the control of the control unit 9, a first workpiece 80 is unloaded from the first cassette 21, for example. Specifically, the vertical hand moving mechanism 144 vertically moves the robot hand 140 of the robot 14 to position the robot hand 140 at a height or vertical position aligned with the shelf 226, e.g., the lowermost shelf 226 in FIG. 2, where the first workpiece 80 is stored in the first cassette 21.

In the first cassette 21, the face side 801 of the workpiece 80 faces downwardly, for example, and the reverse side 802 faces upwardly. Then, the suction surface 1404 of the robot hand 140 is set to an upwardly facing state, i.e., a state facing in the +Z direction.

The robot hand 140 is turned to enter the first cassette 21 to a predetermined position therein through the opening 210 of the first cassette 21 and is positioned at the predetermined position in a horizontal plane where the center of the robot hand 140 and the center of the workpiece 80 are in substantial alignment with each other, for example. Then, the robot hand 140 is lifted to bring the suction surface 1404 thereof into contact with the face side 801 of the workpiece 80 and cause the suction surface 1404 to hold the workpiece 80 under suction. The robot hand 140 stops being lifted when the workpiece 80 lifted by the robot hand 140 has its outer circumferential edge slightly spaced from the shelf 226.

The robot hand 140 that has held the workpiece 80 under suction is moved in the +Y direction, unloading the workpiece 80 out of the first cassette 21. Note that the robot hand 140 may bring the suction surface 1404 into abutment against the workpiece 80 from above to hold the workpiece 80 under suction.

The robot 14 illustrated in FIG. 1 then moves the workpiece 80 over the temporary rest table 11 and places the workpiece 80 with the face side 801 facing downwardly onto the temporary rest table 11. Specifically, the robot hand 140 is lowered to place the workpiece 80 onto the temporary rest table 11 such that the temporary rest table 11 enters the U-shaped opening in the suction member 1400 of the robot hand 140.

Then, the positioning pins of the positioning unit 119 are moved radially inwardly while being kept in a circular array and selectively push the outer circumferential edge of the workpiece 80, correcting the position of the workpiece 80. For example, the six positioning pins illustrated in FIG. 6 stop moving when they all contact the outer circumferential edge of the workpiece 80. As a result, the center of the workpiece 80 is aligned with the center of the temporary rest table 11, so that the control unit 9 can recognize the central position of the first workpiece 80. Thereafter, the workpiece 80 is held under suction on the temporary rest table 11.

Since the workpiece 80 has the arcuate recess as the mark 805 representing the orientation flat, one of the six positioning pins illustrated in FIG. 1 that is positioned at the mark 805 is moved radially inwardly by a larger distance than the other positioning pins in centering the workpiece 80, for example. Consequently, the different distance that one of the six positioning pins is moved radially inwardly allows the control unit 9 to recognize the position of the mark 805 of the workpiece 80 centered on the temporary rest table 11. Then, for example, the temporary rest table 11 that has held the workpiece 80 under suction is turned through a certain angle under the control of the control unit 9 to orient the mark 805 of the workpiece 80 in a predetermined direction. According to an alternative approach, for example, an image capturing unit may be positioned above the temporary rest table 11, and the control unit 9 may analyze an image of the workpiece 80 captured by the image capturing unit and recognize the center and the mark 805 of the workpiece 80 on the temporary rest table 11 from the image.

Next, the loading arm 131 holds and moves the workpiece 80 that has been centered on the temporary rest table 11 and whose mark has been placed in a predetermined circumferential position onto the chuck table 30.

As described above, the holding surface 302 of the chuck table 30 has the orientation flat alignment part for aligning itself with the mark 805 of the workpiece 80 when the workpiece 80 is placed on the chuck table 30. The chuck table 30 is turned to angularly position the orientation flat alignment part into alignment with the mark 805 of the workpiece 80 on the chuck table 30. Specifically, the position of the mark 805 of the workpiece 80 at the time the loading arm 131 holds the workpiece 80 has already been recognized by the control unit 9 when the loading arm 131 delivers from the temporary rest table 11 to the chuck table 30. The control unit 9 controls the chuck table rotating mechanism 36 to turn the chuck table 30 through a certain angle to bring the orientation flat alignment part of the chuck table 30 into positional alignment with the mark 805 of the workpiece 80 delivered from the temporary rest table 11 to the chuck table 30 by the loading arm 131. The workpiece 80 is then placed, with the reverse side 802 facing upwardly, on the holding surface 302 of the chuck table 30 such that the center of the chuck table 30 and the center of the workpiece 80 are substantially aligned with each other.

The suction force produced when the suction source held in fluid communication with the suction member 300 is actuated is transmitted to the holding surface 302 of the chuck table 30, enabling the chuck table 30 to hold the workpiece 80 under suction on the holding surface 302. Further, the circumferential position of the mark 805 of the workpiece 80 held under suction on the holding surface 302 has been recognized by the control unit 9. Since the control unit 9 controls the chuck table rotating mechanism 36, the control unit 9 continues to recognize the circumferential position of the mark 805 of the workpiece 80 at all times after the workpiece 80 has started to be ground or has been ground.

After the chuck table 30 has held the workpiece 80 under suction on the holding surface 302, the table moving mechanism 17 moves the chuck table 30 in the +Y direction. The chuck table 30 with the workpiece 80 held thereon is moved until it is brought into a position where the center of rotation of the grinding wheel 164 of the processing unit 16 is horizontally shifted a predetermined distance from the center of rotation of the workpiece 80 and the track to be followed by the grindstones as they rotate passes through the center of rotation of the workpiece 80.

For example, before a grinding process for grinding the first workpiece 80 is started, the thickness measuring unit 38 measures the charged thickness of the workpiece 80. The charged thickness refers to the thickness of the workpiece 80 at the time the workpiece 80 is charged into the processing area 101, i.e., before the workpiece 80 is processed. Information of the charged thickness of the workpiece 80 measured by the thickness measuring unit 38 is sent to the first determining section 901 of the determining section 90 of the control unit 9. The control unit 9 includes a storage medium that stores a preset allowable range for the charged thickness of the workpiece 80. The first determining section 901 determines by way of comparison whether the charged thickness of the first workpiece 80 falls within the allowable range for the charged thickness or not.

For example, the first determining section 901 determines that the charged thickness of the first workpiece 80 falls within the allowable range for the charged thickness. In this case, the grinding process for grinding the workpiece 80 is started.

The processing unit 16 is fed in the −Z direction by the grinding feed mechanism 19, bringing the rotating grindstones into contact with the reverse side 802 of the workpiece 80 held on the chuck table 30 to thereby grind the reverse side 802 of the workpiece 80. As the chuck table rotating mechanism 36 rotates the chuck table 30 at a predetermined rotational speed, the workpiece 80 on the holding surface 302 rotates in unison therewith, causing the grindstones to grind the reverse side 802 of the workpiece 80 in its entirety. While the workpiece 80 is being ground, the grinding fluid is supplied through the fluid channel to a contact area where the grindstones and the reverse side 802 of the workpiece 80 contact each other, cooling and cleaning the contact area.

During the grinding process, the thickness measuring unit 38 sequentially measures the thickness of the workpiece 80 and sends information of the measured thickness to the first determining section 901 of the determining section 90 of the control unit 9. For example, the storage medium of the control unit 9 also stores a finished thickness of the workpiece 80 and an allowable range of ±several μm, for example, for the finished thickness. The first determining section 901 sequentially monitors the measurements from the thickness measuring unit 38 to determine whether or not the thickness of the first workpiece 80 while it is being ground falls within the finished thickness and the allowable range of ±several μm.

For example, the thickness measuring unit 38 measures the thickness of the workpiece 80 and the first determining section 901 monitors the thickness of the workpiece 80. The processing unit 16 is lifted and spaced away from the workpiece 80 that has been normally ground to the finished thickness, after which the chuck table 30 with the workpiece 80 held under suction thereon is turned through a predetermined angle under the control of the control unit 9 to orient the mark 805 of the workpiece 80 in a predetermined direction. Then, the table moving mechanism 17 moves the chuck table 30 in the −Y direction to a position near the unloading arm 132.

Next, the unloading arm 132 holds and delivers the workpiece 80 with the mark 805 placed in a predetermined circumferential position from the chuck table 30 to the spinner table 120. The workpiece 80 is placed, with the reverse side 802 facing upwardly, on the spinner table 120 that is smaller in diameter than the workpiece 80, whereupon the workpiece 80 is held under suction on the spinner table 120. The center of the workpiece 80 and the center of the spinner table 120 are in substantial alignment with each other. Then, the cleaning nozzle 121 is angularly moved reciprocably over the workpiece 80 through a predetermined angle while ejecting the cleaning fluid to the reverse side 802 of the workpiece 80. At the same time, the spinner table rotating mechanism 126 rotates the spinner table 120 at a predetermined rotational speed, allowing the cleaning fluid to be supplied to the reverse side 802 of the workpiece 80 in its entirety, thereby cleaning the reverse side 802.

The encoder 125 associated with the electric motor 123 of the spinner table rotating mechanism 126 outputs an encoder signal to the control unit 9 while the spinner table 120 is in rotation. The control unit 9 sequentially recognizes the angular position of the mark 805 of the rotating workpiece 80 on the basis of the received encoder signal.

After the workpiece 80 has been cleaned for a predetermined period of time, the spinner table 120 stops being rotated, and the cleaning nozzle 121 applies air, for example, to the workpiece 80, drying the workpiece 80. Then, the image capturing unit 127 captures an image of the reverse side 802 of the workpiece 80. The captured image is sent from the image capturing unit 127 to the second determining section 902 of the determining section 90 of the control unit 9. The second determining section 902 analyzes the captured image while performing a binarizing process, an edge processing process, etc. on the captured image on a virtual output screen, and determines whether the workpiece 80 is cracked, chipped on its outer circumference, wavy, or burned on its surface or not from the captured image. For example, the second determining section 902 determines that the first workpiece 80 that has been ground is not cracked, chipped, wavy, or burned.

Therefore, the first workpiece 80 has been determined by the first determining section 901 to be appropriately ground to the finished thickness and has also been determined by the second determining section 902 to be free of a grinding failure, i.e., to not be cracked, chipped, wavy, or burned. In a case where the determining section 90 thus determines that the workpiece 80 has been properly processed, the control unit 9 performs the control process for orienting the mark 805 in the properly processed direction 99 (see FIG. 4) and stores the properly processed workpiece 80 into the second cassette 22.

Specifically, the robot hand 140 of the robot 14 illustrated in FIG. 1 is moved in the Z-axis directions by the vertical hand moving mechanism 144 to a predetermined vertical position where the suction surface 1404 that is facing upwardly can hold the face side 801 of the workpiece 80 on the spinner table 120 under suction. In addition, the robot hand 140 is turned by the horizontal hand moving mechanism 142 until the U-shaped opening in the suction member 1400 of the robot hand 140 is positioned directly opposite the spinner table 120 in the X-axis directions. In other words, as illustrated in FIG. 3, the robot hand 140 has its distal end portion oriented in the −X direction.

Figure 3:
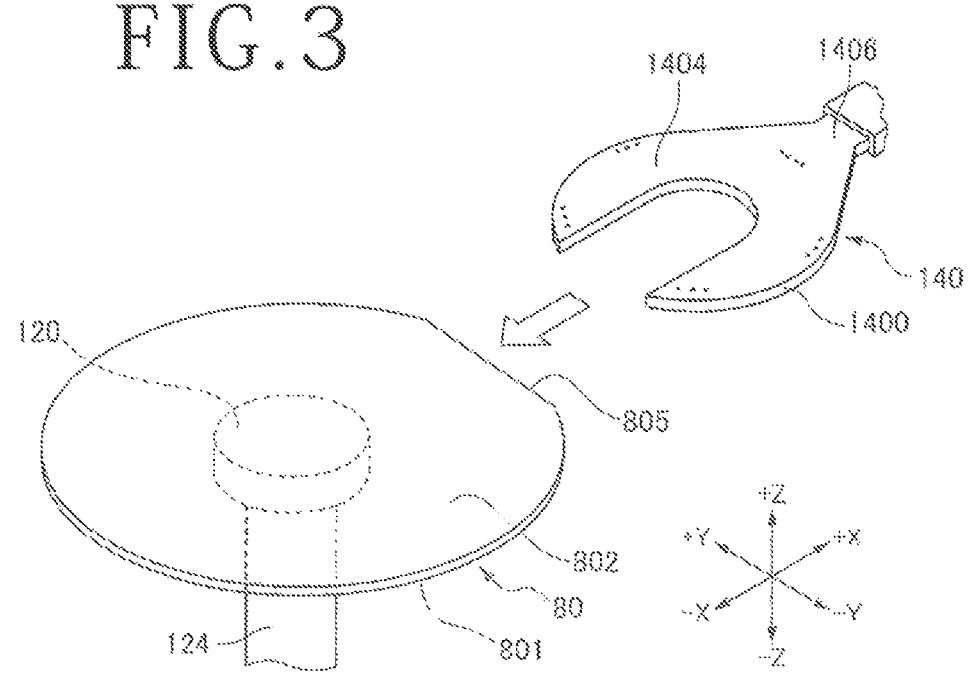
FIG. 3 is a perspective view illustrating the manner in which a ground workpiece held under suction on a spinner table is unloaded by a robot hand.

The spinner table 120 with the workpiece 80 held under suction thereon is turned through a predetermined angle under the control of the control unit 9 illustrated in FIG. 1 to orient the mark 805 of the workpiece 80 in the +X direction, directly opposite the U-shaped opening in the suction member 1400 of the robot hand 140, as illustrated in FIG. 3.

The horizontal hand moving mechanism 142 moves the robot hand 140 linearly in the −X direction to cause the spinner table 120 to enter the U-shaped opening in the suction member 1400. The robot hand 140 is then placed in a horizontal plane at a predetermined position where the center of the robot hand 140 and the center of the workpiece 80 are in substantial alignment with each other, for example. Then, the robot hand 140 is lifted to bring the suction surface 1404 into contact with the face side 801 of the workpiece 80, whereupon the suction surface 1404 holds the workpiece 80 under suction. The mark 805 of the workpiece 80 is oriented toward the base 1406 of the robot hand 140.

Then, the robot hand 140 that is holding the workpiece 80 under suction is turned by the horizontal hand moving mechanism 142 under the control of the control unit 9 until the robot hand 140 is positioned directly opposite the front opening 220 of the second cassette 22 in the Y-axis directions. In other words, the mark 805 of the workpiece 80 held under suction by the robot hand 140 is oriented in the +Y direction.

Furthermore, the robot hand 140 is lowered to the vertical position of the shelf 226, e.g., the lowermost shelf 226 in FIG. 2, where the workpiece 80 is to be stored in the second cassette 22. The robot hand 140 is moved linearly in the −Y direction to a predetermined position in the second cassette 22. Then, the robot hand 140 releases the workpiece 80, which is placed on the shelf 226 in the second cassette 22 with the reverse side 802 facing upwardly. Thereafter, the robot hand 140 positioned below the workpiece 80 is retracted out of the second cassette 22.

Figure 4:
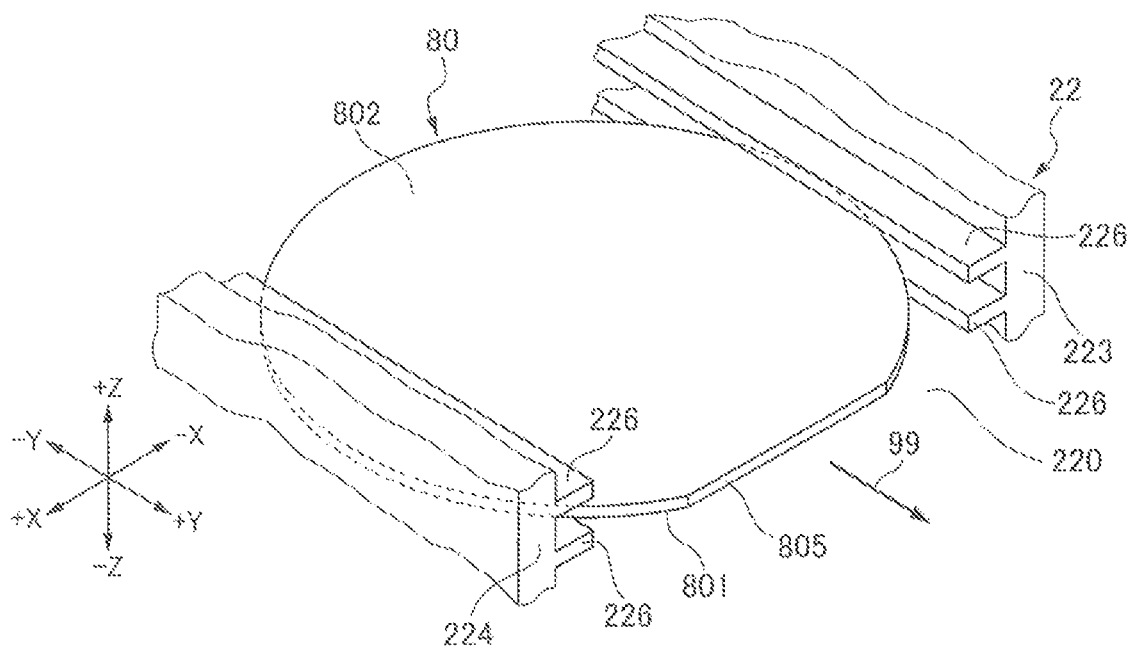
FIG. 4 is a perspective view illustrating a workpiece stored in the second cassette after a control unit has performed a control process for orienting a mark on a workpiece in a properly processed direction.

Consequently, as illustrated in FIG. 4, the first workpiece 80 is stored on the shelf 226 in the second cassette 22 with the mark 805 oriented in the properly processed direction 99, i.e., oriented in the +Y direction toward the front opening 220 of the second cassette 22.

(Grinding of Second Workpiece 80)

While the first workpiece 80, for example, is being ground by the grinding wheel 164 as described above, the robot 14 illustrated in FIG. 1 unloads a second workpiece 80 to be ground next from the first cassette 21 in the same manner as the first workpiece 80 is unloaded. Then, the robot 14 illustrated in FIG. 1 moves the second workpiece 80 over the temporary rest table 11. As with the first workpiece 80, the second workpiece 80 is centered on the temporary rest table 11, and the circumferential position of the mark 805 of the second workpiece 80 is recognized by the control unit 9.

After the ground first workpiece 80 has been unloaded from the chuck table 30 by the unloading arm 132, making the chuck table 30 unoccupied, the loading arm 131 holds and moves the second workpiece 80 that has been centered on the temporary rest table 11 and has the mark 805 brought to the circumferential position over the chuck table 30. The second workpiece 80 is then held under suction on the chuck table 30 while the center of the second workpiece 80 and the center of the chuck table 30 are being aligned with each other and also while the orientation flat alignment part of the chuck table 30 and the mark 805 of the second workpiece 80 are being aligned with each other.

After the chuck table 30 has held the workpiece 80 under suction thereon, the table moving mechanism 17 moves the chuck table 30 in the +Y direction. The workpiece 80 and the grinding wheel 164 of the processing unit 16 are then positioned with respect to each other.

Before a grinding process for grinding the second workpiece 80 is started, the thickness measuring unit 38 measures the charged thickness of the workpiece 80. Information of the charged thickness is sent to the first determining section 901. The first determining section 901 determines by way of comparison whether the charged thickness of the second workpiece 80 falls within the allowable range for the charged thickness or not. For example, the first determining section 901 determines that the charged thickness of the second workpiece 80 does not fall within the allowable range. Note that the charged thickness of the second workpiece 80 does not fall within the allowable range in a case where the charged thickness of the second workpiece 80 is larger than the allowable range for the charged thickness, i.e., in a case where the workpiece 80 is too thick, or in a case where the charged thickness of the second workpiece 80 is smaller than the allowable range for the charged thickness, i.e., in a case where the workpiece 80 is too thin.

In this instance, the first determining section 901 controls a speaker of the processing apparatus 1 to issue a warning sound or controls a display device such as a display monitor, or a touch panel of the processing apparatus 1 to display an error message, indicating to the worker who handles the processing apparatus 1 the determined result that since the charged thickness of the second workpiece 80 is larger than the allowable range for the charged thickness, i.e., the workpiece 80 is too thick, or the charged thickness of the second workpiece 80 is smaller than the allowable range for the charged thickness, i.e., the workpiece 80 is too thin, the processing apparatus 1 will perform no grinding process on the second workpiece 80.

Moreover, the second workpiece 80 is not ground, but stored into the second cassette 22 under the control of the control unit 9. Specifically, the table moving mechanism 17 moves the chuck table 30 to a position near the unloading arm 132. The unloading arm 132 then holds and moves the workpiece 80 whose mark 805 has been placed in the circumferential position from the chuck table 30 to the spinner table 120.

The robot hand 140 is brought to a predetermined height or vertical position in order to hold the face side 801 of the workpiece 80 on the spinner table 120 under suction with the reverse side 802 facing upwardly. In addition, the robot hand 140 is turned by the horizontal hand moving mechanism 142 until the U-shaped opening in the suction member 1400 of the robot hand 140 is oriented in the −X direction and positioned directly opposite the spinner table 120 in the X-axis directions.

The spinner table 120 with the workpiece 80 held under suction thereon is turned through a predetermined angle under the control of the control unit 9 until the mark 805 of the workpiece 80 is oriented at an angle of 45 degrees with respect to the U-shaped opening in the robot hand 140, clockwise as viewed from the +Z direction, for example.

The robot hand 140 illustrated in FIG. 1 is moved linearly in the −X direction by the horizontal hand moving mechanism 142, and then holds the workpiece 80 under suction such that the center of the robot hand 140 and the center of the workpiece 80 are in substantial alignment with each other. The mark 805 of the workpiece 80 has been angularly spaced 45 degrees clockwise as viewed from the +Z direction with respect to the base 1406 of the robot hand 140.

The robot hand 140 turned by the horizontal hand moving mechanism 142 under the control of the control unit 9 is positioned directly opposite the front opening 220 of the second cassette 22 in the Y-axis directions. Furthermore, the robot hand 140 is lifted or lowered to the vertical position of the shelf 226, e.g., the next shelf 226 higher than the lowermost shelf 226 in FIG. 2, where the workpiece 80 is to be stored in the second cassette 22. The robot hand 140 is moved linearly in the −Y direction to a predetermined position in the second cassette 22. Then, the robot hand 140 releases the workpiece 80, which is placed on the shelf 226 in the second cassette 22 with the reverse side 802 facing upwardly. Thereafter, the robot hand 140 positioned below the workpiece 80 is retracted out of the second cassette 22.

Figure 5:
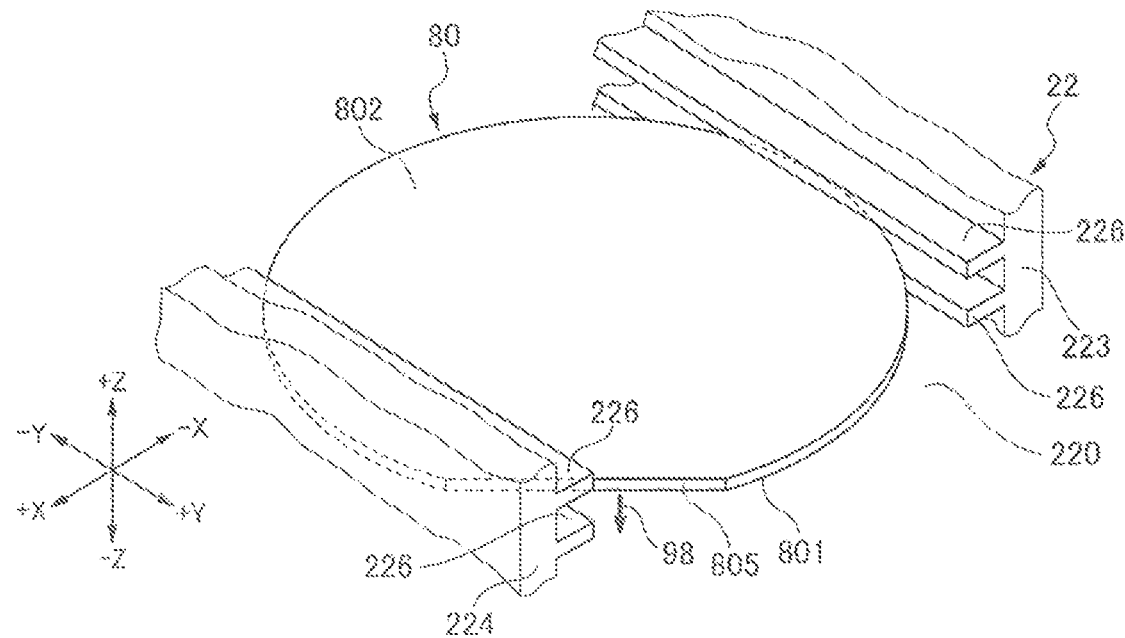
FIG. 5 is a perspective view illustrating a workpiece stored in the second cassette after a control unit has performed a control process for orienting a mark on a workpiece in a processed thickness abnormality direction.

Therefore, as illustrated in FIG. 5, the second workpiece 80 is stored on the shelf 226 in the second cassette 22 with the mark 805 oriented in the processed thickness abnormality direction 98, i.e., oriented in the direction 98 angularly spaced 45 degrees clockwise as viewed from above with respect to the front opening 220, which faces in the +Y direction, of the second cassette 22.

(Grinding of Third Workpiece 80)

While the thickness of the second workpiece 80, for example, is being measured as described above, the robot 14 illustrated in FIG. 1 unloads a third workpiece 80 to be ground next from the first cassette 21 in the same manner as the first workpiece 80 is unloaded.

Then, the robot 14 illustrated in FIG. 1 moves the third workpiece 80 over the temporary rest table 11. As with the first workpiece 80, the third workpiece 80 is centered on the temporary rest table 11, and the circumferential position of the mark 805 of the third workpiece 80 is recognized by the control unit 9.

After the second workpiece 80 has been unloaded unground from the chuck table 30 by the unloading arm 132, making the chuck table 30 unoccupied, the loading arm 131 holds and moves the third workpiece 80 that has been centered on the temporary rest table 11 and has the mark 805 brought to the circumferential position over the chuck table 30. The third workpiece 80 is then held under suction on the chuck table 30 while the center of the third workpiece 80 and the center of the chuck table 30 are being aligned with each other and also while the orientation flat alignment part of the chuck table 30 and the mark 805 of the third workpiece 80 are being aligned with each other.

After the chuck table 30 has held the workpiece 80 under suction thereon, the table moving mechanism 17 moves the chuck table 30 in the +Y direction, and the workpiece 80 and the grinding wheel 164 of the processing unit 16 are then positioned with respect to each other. Moreover, before a grinding process for grinding the third workpiece 80 is started, for example, the thickness measuring unit 38 measures the charged thickness of the workpiece 80. The first determining section 901 that has received information of the measured charged thickness determines that the charged thickness of the third workpiece 80 falls within the allowable range. In this case, the grinding process for grinding the third workpiece 80 is started.

During the grinding process for grinding the third workpiece 80, which is carried out in the same manner as the grinding process for grinding the first workpiece 80, the thickness measuring unit 38 sequentially measures the thickness of the workpiece 80 and sends information of the measured thickness to the first determining section 901 of the determining section 90. The first determining section 901 sequentially monitors the measurements from the thickness measuring unit 38 to determine whether or not the thickness of the third workpiece 80 while it is being ground falls within the finished thickness and the allowable range of ±several μm.

Even though the thickness measuring unit 38 measures the thickness of the workpiece 80 and the first determining section 901 monitors the thickness of the workpiece 80, for example, there may occur a time lag due to the magnitude of processing tasks of the control unit 9 until the measured thickness information of the workpiece 80 that is obtained by the thickness measuring unit 38 is sent to the first determining section 901. The time lag may delay controlling the grinding feed mechanism 19 with the control unit 9, tending to cause a delay in lifting the processing unit 16 from the workpiece 80 with the grinding feed mechanism 19. As a result, the ground third workpiece 80 may be made thinner than the thickness calculated by subtracting the allowable range from the predetermined finished thickness. Note that the workpiece 80 may be made thinner than the thickness calculated by subtracting the allowable range from the predetermined finished thickness, also due to the state of the grindstones, etc.

Furthermore, even though the thickness measuring unit 38 measures the thickness of the workpiece 80 and the first determining section 901 monitors the thickness of the workpiece 80, for example, the workpiece 80 may not be appropriately ground in a case where the reverse side 802 of the workpiece 80 suffers an abnormality such as a surface burn or in a case where the grindstones of the processing unit are not well dressed during grinding. In this case, when the processing unit 16 is lifted from the workpiece 80 under the control of the grinding feed mechanism 19 controlled by the control unit 9, the third workpiece 80 that has been ground may be made thicker than the thickness calculated by adding the allowable range to the predetermined finished thickness.

In this instance, the first determining section 901 controls the speaker of the processing apparatus 1 to issue a warning sound or controls the display device such as a touch panel of the processing apparatus 1 to display an error message, indicating to the worker the determined result that the thickness of the third workpiece 80 that has been ground is suffering a thickness abnormality.

For example, the chuck table 30 with the workpiece 80 held under suction thereon is turned through a predetermined angle under the control of the control unit 9 to orient the mark 805 of the ground third workpiece 80 in a predetermined direction. Then, the chuck table 30 is moved in the −Y direction and positioned near the unloading arm 132, which delivers the workpiece 80 from the chuck table 30 to the spinner table 120.

After the cleaning unit 12 has cleaned and dried the workpiece 80, the image capturing unit 127 captures an image of the reverse side 802 of the workpiece 80. The second determining section 902 determines whether the workpiece 80 is cracked, chipped on its outer circumference, wavy, or burned on its surface or not from the captured image. For example, the second determining section 902 determines that the third workpiece 80 that has been ground is not cracked, chipped, wavy, or burned.

The control unit 9 performs a control process for orienting the mark 805 of the ground third workpiece 80 that the first determining section 901 of the determining section 90 has determined as suffering a thickness abnormality, in the processed thickness abnormality direction 98 (see FIG. 5) and stores the workpiece 80 into the second cassette 22. Specifically, the control unit 9 performs the same control process as the control process described above for storing the second workpiece 80 into the second cassette 22, storing the third workpiece 80 on the shelf 226 of the second cassette 22 with the mark 805 oriented in the processed thickness abnormality direction 98, i.e., in the direction angularly spaced 45 degrees clockwise as viewed from above with respect to the front opening 220, which faces in the +Y direction, of the second cassette 22.

(Grinding of Fourth Workpiece 80)

While the third workpiece 80, for example, is being ground by the grinding wheel 164 as described above, the robot 14 unloads a fourth workpiece 80 to be ground next from the first cassette 21 illustrated in FIG. 1 in the same manner as the first workpiece 80 is unloaded. Then, as with the first workpiece 80, the fourth workpiece 80 delivered by the robot 14 is centered on the temporary rest table 11, and the circumferential position of the mark 805 is recognized by the control unit 9.

After the third workpiece 80 has been unloaded from the chuck table 30 by the unloading arm 132, the fourth workpiece 80 centered with the mark 805 placed in the circumferential position is moved onto the chuck table 30 by the loading arm 131. The fourth workpiece 80 is then held under suction on the chuck table 30 while the center of the fourth workpiece 80 is being centrally aligned with the chuck table 30 and also while the orientation flat alignment part of the chuck table 30 and the mark 805 of the fourth workpiece 80 are being aligned with each other.

After the chuck table 30 has held the workpiece 80 under suction thereon, the table moving mechanism 17 positions the workpiece 80 and the grinding wheel 164 of the processing unit 16 with respect to each other. Furthermore, before a grinding process for grinding the fourth workpiece 80 is started, the thickness measuring unit 38 measures the charged thickness of the workpiece 80. The first determining section 901 that has received information of the measured charged thickness determines that the charged thickness of the fourth workpiece 80 falls within the allowable range.

During the grinding process for grinding the fourth workpiece 80, which is carried out in the same manner as the grinding process for grinding the first workpiece 80, the thickness measuring unit 38 sequentially measures the thickness of the workpiece 80 and sends information of the measured thickness to the first determining section 901. The first determining section 901 sequentially monitors the measurements from the thickness measuring unit 38 to determine whether or not the thickness of the fourth workpiece 80 while it is being ground falls within the finished thickness and the allowable range of ±several μm.

After the processing unit 16 has been left and spaced from the workpiece 80 that is normally ground to the finished thickness while the thickness measuring unit 38 is measuring the thickness of the workpiece 80 and the first determining section 901 is monitoring the thickness of the workpiece 80, the chuck table 30 that has held the workpiece 80 under suction thereon is turned through a predetermined angle under the control of the control unit 9 to orient the mark 805 of the workpiece 80 in a predetermined direction. Then, the table moving mechanism 17 moves the chuck table 30 in the −Y direction to a position near the unloading arm 132.

The unloading arm 132 then holds and moves the workpiece 80 whose mark 805 has been placed in a predetermined circumferential position from the chuck table 30 to the spinner table 120. After the cleaning unit 12 has cleaned and dried the fourth workpiece 80, the image capturing unit 127 captures an image of the reverse side 802 of the workpiece 80. The second determining section 902 determines whether the workpiece 80 is cracked, chipped on its outer circumference, wavy, or burned on its surface or not from the captured image. For example, the second determining section 902 determines that the fourth workpiece 80 has a crack 808 (see FIG. 6). In this case, the second determining section 902 issues an alarm sound or displays an error message, indicating to the worker the determined result that the ground fourth workpiece 80 suffers a processing abnormality.

Then, the control unit 9 performs a control process for orienting the mark 805 of the ground fourth workpiece 80 that has been determined as having the crack 808 by the second determining section 902, in the processed crack, etc. abnormality direction 97 (see FIG. 6), and stores the fourth workpiece 80 into the second cassette 22.

Specifically, the robot hand 140 is brought to a predetermined height or vertical position in order to hold the face side 801, which is facing downwardly, of the workpiece 80 on the spinner table 120 under suction. In addition, the robot hand 140 is turned until the U-shaped opening of the robot hand 140 is oriented in the −X direction and positioned directly opposite the spinner table 120 in the X-axis directions.

The spinner table 120 is turned through a predetermined angle under the control of the control unit 9 until the mark 805 of the workpiece 80 is oriented at an angle of 45 degrees with respect to the U-shaped opening in the robot hand 140, counterclockwise as viewed from the +Z direction, for example.

The horizontal hand moving mechanism 142 moves the robot hand 140 linearly in the −X direction to until the center of the robot hand 140 and the center of the workpiece 80 are in substantial alignment with each other, whereupon the robot hand 140 holds the workpiece 80 under suction. The mark 805 of the workpiece 80 is oriented at an angle of 45 degrees with respect to the base 1406 of the robot hand 140, counterclockwise as viewed from the +Z direction.

Then, the robot hand 140 is turned by the horizontal hand moving mechanism 142 under the control of the control unit 9 until the robot hand 140 is positioned directly opposite the front opening 220 of the second cassette 22 in the Y-axis directions. Furthermore, the robot hand 140 is lifted or lowered to the vertical position of the shelf 226 where the workpiece 80 is to be stored in the second cassette 22. Further, the robot hand 140 is moved linearly in the −Y direction to a predetermined position in the second cassette 22. Then, the robot hand 140 releases the workpiece 80, which is placed on the shelf 226 in the second cassette 22 with the reverse side 802 facing upwardly. Thereafter, the robot hand 140 is retracted out of the second cassette 22.

Figure 6:
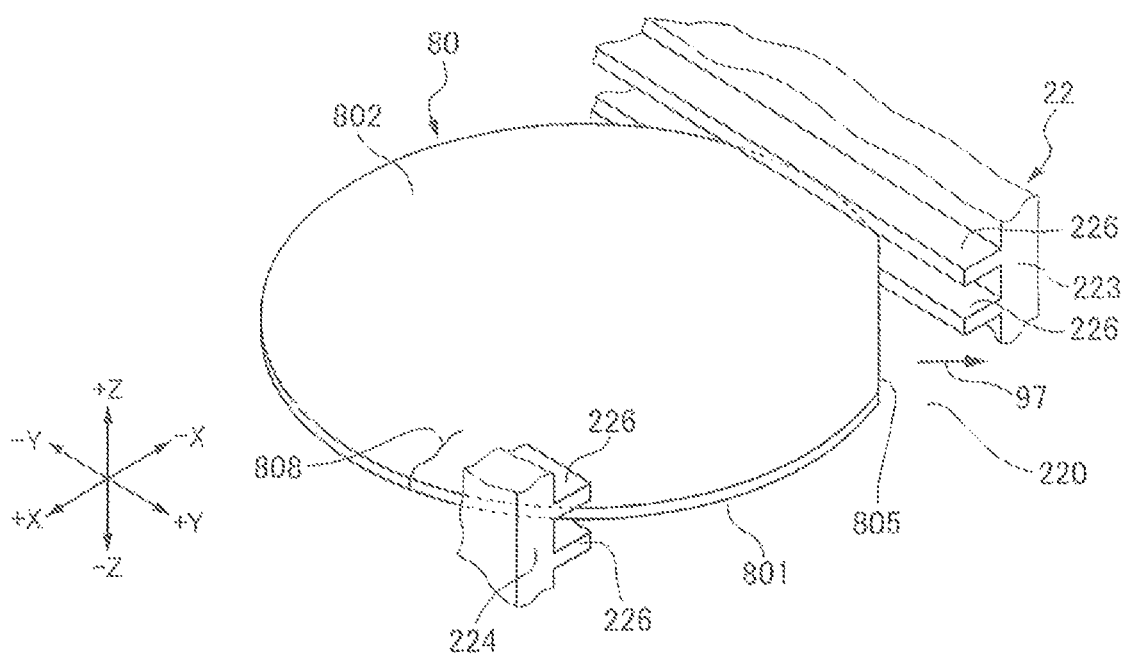
FIG. 6 is a perspective view illustrating a workpiece stored in the second cassette after a control unit has performed a control process for orienting a mark on a workpiece in a processed crack, etc. abnormality direction.

Therefore, as illustrated in FIG. 6, the fourth workpiece 80 is stored on the shelf 226 in the second cassette 22 while the mark 805 is being oriented in the processed crack, etc. abnormality direction 97, i.e., in the direction angularly spaced 45 degrees counterclockwise as viewed from above with respect to the front opening 220, which faces in the +Y direction, of the second cassette 22.

The processing apparatus 1 according to the present invention includes the determining section 90 that determines whether a workpiece 80 has been normally processed or has not been normally processed, and the control unit 9 that performs a control process for orienting the mark 805 of the workpiece 80 in a predetermined direction, i.e., the properly processed direction 99 illustrated in FIG. 4, if the determining section 90 determines that the workpiece 80 has been properly processed, and stores the workpiece 80 in the second cassette 22, and that performs a control process for orienting the mark 805 of the workpiece 80 in a direction different from the properly processed direction 99, i.e., the processed thickness abnormality direction 98 illustrated in FIG. 5 or the processed crack, etc. abnormality direction 97 illustrated in FIG. 6, for example, if the determining section 90 determines that the workpiece 80 has not been properly processed, and stores the workpiece 80 in the second cassette 22. Therefore, the worker can easily know whether the workpiece 80 has been properly processed, i.e., the first workpiece 80, or has not been properly processed, i.e., either one of the second through fourth workpieces 80, by looking at the orientation of the mark 805 of the workpiece 80 stored in the second cassette 22. For example, the worker can then easily remove only the workpiece 80 that has not been properly processed without taking the trouble to compare workpiece data on a display screen of the apparatus. Consequently, after the second cassette 22 has been filled up, it is possible for the worker to easily deliver the second cassette 22 from which workpieces 80 that have not been properly processed have been removed to an apparatus in a next processing step.

The processing apparatus 1 according to the present invention includes the thickness measuring unit 38 for measuring the thickness of a workpiece 80, and the determining section 90 determines whether the workpiece 80 has been properly processed or has not been properly processed on the basis of the thickness of the workpiece 80 measured by the thickness measuring unit 38, so that the control unit 9 can easily perform the control process for orienting the mark 805 of the workpiece 80 in the predetermined direction 99, i.e., the properly processed direction 99 illustrated in FIG. 4, or the control process for orienting the mark 805 of the workpiece 80 in the direction 98 different from the properly processed direction 99, i.e., the processed thickness abnormality direction 98 illustrated in FIG. 5.

The determining section 90 includes a plurality of determining sections, i.e., the first determining section 901 and the second determining section 902 according to the present embodiment, that determine whether the workpiece 80 is a workpiece that has been properly processed or a workpiece that has not been properly processed according to respective different determining criteria, and if at least one of the first determining section 901 and the second determining section 902 determines that the workpiece 80 has not been properly processed, the control unit 9 performs the control process for orienting the mark 805 in the processed thickness abnormality direction 98 preset by the first determining section 901 that determines that the workpiece 80 has not been properly processed or in the processed crack, etc. abnormality direction 97 preset by the second determining section 902 that determines that the workpiece 80 has not been properly processed as disagreeing with the processed thickness abnormality direction 98, and stores the workpiece 80 in the second cassette 22. The worker can easily know whether the workpiece 80 has been properly processed or has not been properly processed by looking at the orientation of the mark 805 of the workpiece 80 stored in the second cassette 22 and can recognize the kind of an abnormality of the workpiece 80 that has not been properly processed.

The processing apparatus 1 according to the present invention is not limited to the above embodiment but may be reduced to practice in various different forms within the scope of the technical concept of the invention. The outer profiles, etc. of the components of the processing apparatus 1 illustrated in the accompanying drawings are not restrictive but may be changed and modified as far as the advantages of the present invention are applicable.

For example, it is assumed that when the fourth workpiece 80 described above is ground, the first determining section 901 determines that the ground fourth workpiece 80 suffers a thickness abnormality and the second determining section 902 also determines that the ground fourth workpiece 80 suffers a processing abnormality such as the crack 808. In this situation, the control unit 9 may perform a control process for orienting the mark 805 of the workpiece 80 in a direction that is defined in a case where both the first determining section 901 and the second determining section 902 determine that the ground workpiece 80 is abnormal and that is different from the properly processed direction 99 illustrated in FIG. 4 and store the workpiece 80 in the second cassette 22. In this case, for example, the fourth workpiece 80 is stored in the second cassette 22 with the mark 805 facing the rear plate 22S of the second cassette 22 illustrated in FIG. 1, i.e., with the mark 805 facing the back side of the second cassette 22.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A processing apparatus comprising:
 a chuck table for holding a workpiece that has a mark representing a crystal orientation on a holding surface thereof;
 a processing unit for grinding the workpiece held on the chuck table with grindstones or polishing the workpiece held on the chuck table with a polishing pad;
 a cassette stage for placing thereon a cassette for storing a plurality of workpieces on respective plurality of shelves therein;
 a temporary rest table for temporarily placing a workpiece thereon;
 a spinner table for holding a workpiece to be cleaned thereon;
 a robot for delivering a workpiece from the cassette placed on the cassette stage to the temporary rest table or delivering a workpiece held on the spinner table into the cassette placed on the cassette stage;
 a determining section, included in a control unit, for determining whether a workpiece has been properly processed or has not been properly processed; and
 the control unit for performing a control process for orienting the mark of the workpiece in a predetermined angular direction in an X-Y plane, responsive to the determining section determining that the workpiece has been properly processed, and storing the workpiece in a select shelf in the cassette in the predetermined angular direction on the X-Y plane, and performing a control process for orienting the mark of the workpiece in an angular direction in the X-Y plane different from the predetermined angular direction, responsive to the determining section determining that the workpiece has not been properly processed, and storing the workpiece in the select shelf in the cassette in the angular direction different from the predetermined angular direction.

2. The processing apparatus according to claim 1, wherein
the determining section includes a plurality of determining sections,
the angular direction different from the predetermined angular direction includes different angular directions that are preset as disagreeing with each other in association with the respective determining sections,
the determining sections determine whether the workpiece has been properly processed or has not been properly processed according to respective different determining criteria, and
if at least one of the determining sections determines that the workpiece has not been properly processed, the control unit performs a control process for orienting the mark of the workpiece in the predetermined angular direction preset in association with the determining section that determines that the workpiece has not been properly processed and stores the workpiece in the cassette.

3. The processing apparatus according to claim 1, further comprising:
a thickness measuring unit for measuring the thickness of the workpiece, wherein
the determining section determines whether the workpiece has been properly processed or has not been properly processed on a basis of the thickness of the workpiece measured by the thickness measuring unit.

4. The processing apparatus according to claim 3, wherein
the determining section includes a plurality of determining sections,
the angular direction different from the predetermined angular direction includes different angular directions that are preset as disagreeing with each other in association with the respective determining sections,
the determining sections determine whether the workpiece has been properly processed or has not been properly processed according to respective different determining criteria, and
if at least one of the determining sections determines that the workpiece has not been properly processed, the control unit performs a control process for orienting the mark of the workpiece in the predetermined angular direction preset in association with the determining section that determines that the workpiece has not been properly processed and stores the workpiece in the cassette.

5. The processing apparatus according to claim 1, wherein the mark is an orientation flat formed on an outer circumferential portion of the workpiece.

6. The processing apparatus according to claim 5, wherein the orientation flat is formed by removing a part of the outer circumferential portion, leaving an arcuate recess with a flat edge.

* * * * *